US006837333B2

(12) United States Patent
Howze

(10) Patent No.: US 6,837,333 B2
(45) Date of Patent: Jan. 4, 2005

(54) LOUDSPEAKER SYSTEM WITH FORCED AIR CIRCULATION AND CONTROL CIRCUIT THEREFOR

(75) Inventor: Bruce Howze, Broomall, PA (US)

(73) Assignee: Community Light and Sound, Inc., Chester, PA (US)

(*) Notice: Subject to any disclaimer, the term of this patent is extended or adjusted under 35 U.S.C. 154(b) by 93 days.

(21) Appl. No.: 10/114,086

(22) Filed: Apr. 1, 2002

(65) Prior Publication Data

US 2002/0144856 A1 Oct. 10, 2002

Related U.S. Application Data

(63) Continuation-in-part of application No. 09/850,974, filed on May 8, 2001, now Pat. No. 6,390,231.

(60) Provisional application No. 60/281,581, filed on Apr. 5, 2001.

(51) Int. Cl.[7] .................................................. H05K 5/00

(52) U.S. Cl. ....................... 181/148; 181/153; 181/199; 381/397; 381/165

(58) Field of Search ................................ 181/148, 153, 181/154, 157, 173, 166, 184, 196, 199; 381/165, 164, 397, 412, 396

(56) References Cited

U.S. PATENT DOCUMENTS

| | | | | | |
|---|---|---|---|---|---|
| 4,757,547 | A | * | 7/1988 | Danley | 381/165 |
| 4,811,403 | A | | 3/1989 | Henricksen et al. | |
| 4,843,624 | A | | 6/1989 | Rashak | |
| 5,426,707 | A | * | 6/1995 | Wijnker | 381/397 |
| 5,430,804 | A | | 7/1995 | Wijnker | |
| 5,446,793 | A | | 8/1995 | Piccaluga et al. | |
| 5,649,015 | A | | 7/1997 | Paddock et al. | |
| 5,748,760 | A | | 5/1998 | Button | |
| 5,792,999 | A | | 8/1998 | Arnold et al. | |
| 5,909,015 | A | * | 6/1999 | Yamamoto et al. | 181/156 |
| 5,940,522 | A | * | 8/1999 | Cahill et al. | 381/397 |
| 6,535,613 | B1 | * | 3/2003 | Ssutu | 381/397 |
| 6,549,637 | B1 | * | 4/2003 | Risch | 181/160 |
| 2001/0031063 | A1 | * | 10/2001 | Langford et al. | 381/397 |

* cited by examiner

*Primary Examiner*—Rina Duda
*Assistant Examiner*—Eduardo Colon Santana
(74) *Attorney, Agent, or Firm*—Akin Gump Strauss Hauer & Feld LLP

(57) ABSTRACT

A loudspeaker system has a diaphragm for producing sound, a loudspeaker driver mechanism operable for moving the diaphragm in response to an applied electrical signal from an audio signal source, a blower positioned for directing air under pressure over the loudspeaker driver mechanism so that heat generated by the loudspeaker driver mechanism can be convectively removed, and a control circuit electrically connected to the blower and adapted for connection to the audio signal source such that an increase in the applied electrical signal causes a corresponding increase in speed of the blower. The control circuit includes a power limiting device and a switching device that is connected in parallel with the power limiting device. The switching device is actuable from a normally closed state to an open state when the applied electrical signal is above a predetermined level to regulate the speed of the blower.

12 Claims, 4 Drawing Sheets

LOUDSPEAKER SYSTEM WITH FORCED AIR CIRCULATION AND CONTROL CIRCUIT THEREFOR

CROSS-REFERENCE TO RELATED APPLICATIONS

This application is a Continuation-in-Part of U.S. patent application Ser. No. 09/850,974 filed on May 8, 2001 now U.S. Pat. No. 6,390,231. This application also claims the benefit of U.S. Provisional Patent Application No. 60/281,581 filed on Apr. 5, 2001, the disclosure of which is hereby incorporated by reference.

BACKGROUND OF THE INVENTION

This invention relates in general to loudspeakers which produce sound in response to an audio signal, and more particularly to a loudspeaker with an improved air cooling system.

Conventional loudspeakers typically include a cone-shaped diaphragm which is vibrated by an electromechanical driver. The driver generally comprises a magnetic structure and a voice coil located within a gap of the magnetic structure. The voice coil in turn is rigidly attached to the diaphragm. Alternating voltage in the audio frequency range is applied to the terminals of the voice coil causing a corresponding alternating current to flow through the voice coil. The interaction between the current flowing through the voice coil and the magnetic field present in the gap of the magnetic structure causes the voice coil to move either toward or away from the magnetic structure. Since the voice coil is rigidly attached to the diaphragm of the loudspeaker, the movement of the voice coil drives the diaphragm, thus producing acoustical output from the loudspeaker.

A substantial portion of the impedance associated with electromechanical drivers is caused by the wire that forms the voice coil due to the wire's DC resistance. Accordingly, most of the electrical power applied to the voice coil is converted into heat rather than sound. The ultimate power handling capacity of the voice coil, and thus the loudspeaker, is limited by the ability of the device to tolerate heat. Heat tolerance is generally determined by the lowest melting point of wire insulation and other components, as well as the heat capacity of the adhesive used to construct the voice coil.

The problems produced by heat generation are further compounded by temperature-induced resistance, commonly referred to as power compression. As the temperature of the voice coil increases, the DC resistance of the copper or aluminum conductors or wires used in the voice coil also increases, resulting in progressively decreasing efficiency. For example, a copper wire voice coil that has a DC resistance of approximately eight ohms at 68° C. will have a DC resistance of approximately 16 ohms at 270° C. At 270° C., the voice coil will draw less power from the voltage applied to its terminals, and a substantial portion of the power that it does draw will be converted into heat. Consequently, the loudspeaker, which is a relatively inefficient transducer at room temperature, will be further reduced in efficiency at high voice coil temperatures. This power compression increases as the voltage applied to the voice coil increases, and can reach a point where a further increase in applied voltage results in virtually no increase in acoustical output, only a further increase in heat.

In an attempt to reduce the problems associated with voice coil heating, U.S. Pat. No. 4,757,547 issued to Danley on Jul. 12, 1988, discloses cooling a voice coil by blowing air between the voice coil windings and the boundaries of the magnetic gap. Typically, the clearances between the voice coil and the boundaries of the magnetic gap are quite small, usually under 0.020 inch. Forcing sufficient air through these clearances to significantly cool the voice coil requires relatively high air flow at relatively high pressure through the small clearances surrounding the voice coil, resulting in undesirable noise and distortion in the loudspeaker. This patent also discloses connecting the blower in parallel with the audio signal source, either directly or through a rectifier. Connection of the blower in this manner can potentially cause excessive current to be drawn from the audio signal source at high operating levels, possibly exceeding the power capacity of the audio amplifier.

U.S. Pat. No. 4,811,403 issued to Henricksen et al. on Mar. 7, 1989, discloses a cooling system with a thermally conductive load bearing member and a plurality of loudspeakers in thermal engagement with the load bearing member. Air flow, which may be by forced air circulation, cools the load bearing member to thereby cool the loudspeaker that is in thermal engagement with the load bearing member. This cooling method requires a special enclosure of complex design in order to function properly. In addition, the loudspeaker is not in direct contact with the cooling air flow.

U.S. Pat. No. 5,426,707 issued to Wijnker on Jun. 20, 1995, discloses cooling a loudspeaker by forcing air through the narrow gaps between the voice coil and the boundaries of the magnet gap. This is similar to the method disclosed in U.S. Pat. No. 4,757,547, and also would result in undesirable noise and distortion in the loudspeaker.

It is therefore desirable to provide a loudspeaker system that can be cooled during operation without drawing excessive current from the audio signal source. It is further desirable to provide a loudspeaker system with forced air circulation for expelling heat generated by the loudspeaker driver mechanism out of the loudspeaker enclosure to thereby increase both the efficiency and power capacity of the loudspeaker, as well as its reliability and service life.

SUMMARY OF THE INVENTION

In accordance with one aspect of the present invention, a loudspeaker system comprises a diaphragm for producing sound and a loudspeaker driver mechanism operable for moving the diaphragm in response to an applied electrical signal from an audio signal source. The loudspeaker driver mechanism comprises a generally tubular former that is connected to the diaphragm, and a voice coil that is connected to the former at a location spaced from the diaphragm. The former is constructed of a thermally conductive material for conducting heat away from the voice coil. The loudspeaker driver mechanism also includes a permanent magnet with a central opening and a pole piece with a pole vent opening that is coincident with the central opening, with the voice coil located in a space formed between the permanent magnet and the pole piece. An airflow director is positioned at least partially in the former. A gap formed between the airflow director and the former is in fluid communication with the pole vent opening. With this construction, heat generated in the coil during operation of the loudspeaker is transferred to the former through conduction, and heat present in the former is transferred via convection to the gap to thereby cool the loudspeaker system.

In accordance with a further aspect of the present invention, a loudspeaker system comprises a diaphragm for producing sound and a loudspeaker driver mechanism that is operable for moving the diaphragm in response to an applied electrical signal from an audio signal source. The loudspeaker system further comprises a blower that is positioned for directing air under pressure over the loudspeaker driver mechanism so that heat generated by the loudspeaker driver mechanism can be convectively removed, and a control circuit that is electrically connected to the blower and adapted for connection to the audio signal source such that an increase in the applied electrical signal causes a corresponding increase in speed of the blower. The control circuit comprising a power limiting device and a switching device that is connected in parallel with the power limiting device. The switching device is actuable from a normally closed state to an open state when the applied electrical signal is above a predetermined level to thereby regulate the speed of the blower. The regulated speed can be in the form of a reduced speed, a steady speed, or an increased speed that has a maximum rise time and/or value.

In accordance with an even further aspect of the invention, a method of cooling a loudspeaker having a diaphragm and a loudspeaker driver mechanism comprises applying electrical power to the driver mechanism for driving the diaphragm, directing air over the driver mechanism at a flow rate that is proportional to the applied electrical power, and regulating the flow rate when the applied electrical power exceeds a predetermined level. Regulation of the flow rate can include reducing the flow rate, keeping the flow rate constant, or increasing the flow rate to a maximum level and/or rise time.

BRIEF DESCRIPTION OF THE SEVERAL VIEWS OF THE DRAWINGS

The foregoing summary, as well as the following detailed description of preferred embodiments of the invention, will be better understood when read in conjunction with the appended drawings. For the purpose of illustrating the invention, there is shown in the drawings embodiments which are presently preferred. It should be understood, however, that the invention is not limited to the precise arrangements and instrumentalities shown.

The preferred embodiments of the present invention will hereinafter be described in conjunction with the appended drawings, wherein like designations denote like elements, and wherein.

DETAILED DESCRIPTION OF THE INVENTION

Figure 1:
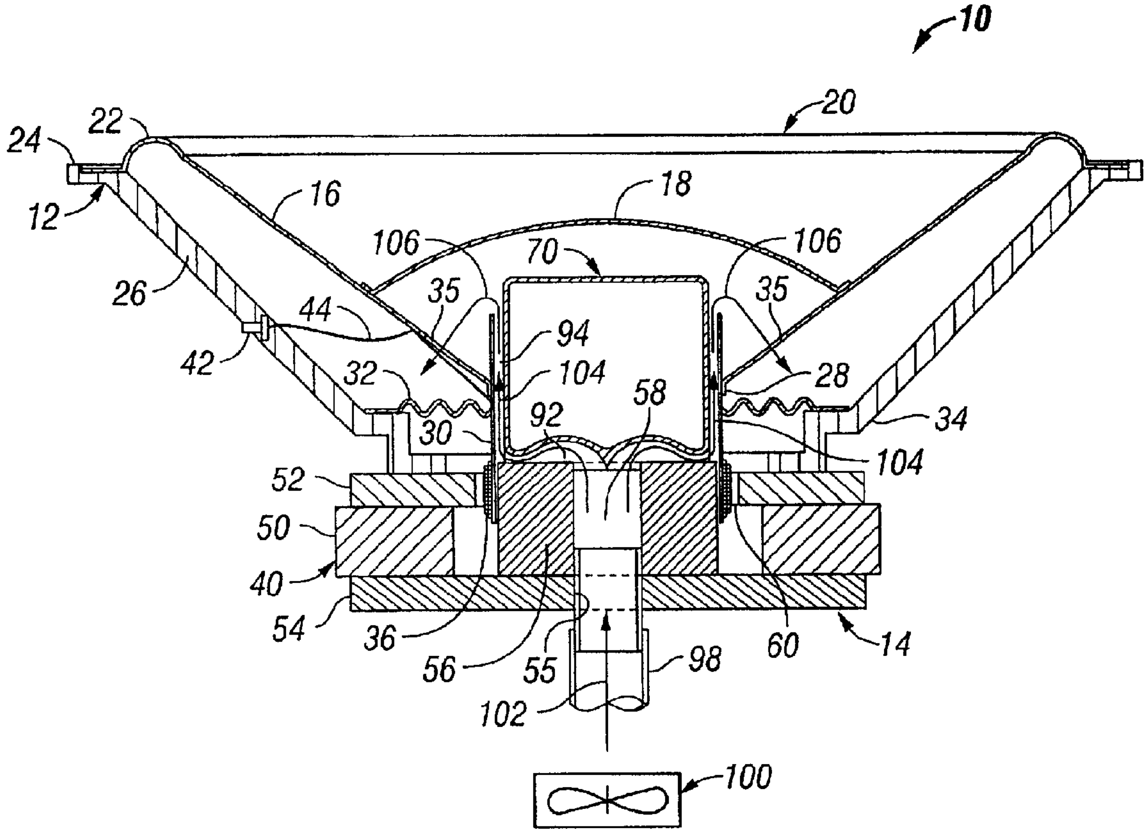
FIG. 1 is a side sectional view of a loudspeaker system with forced air circulation in accordance with the present invention.
Figure 2:
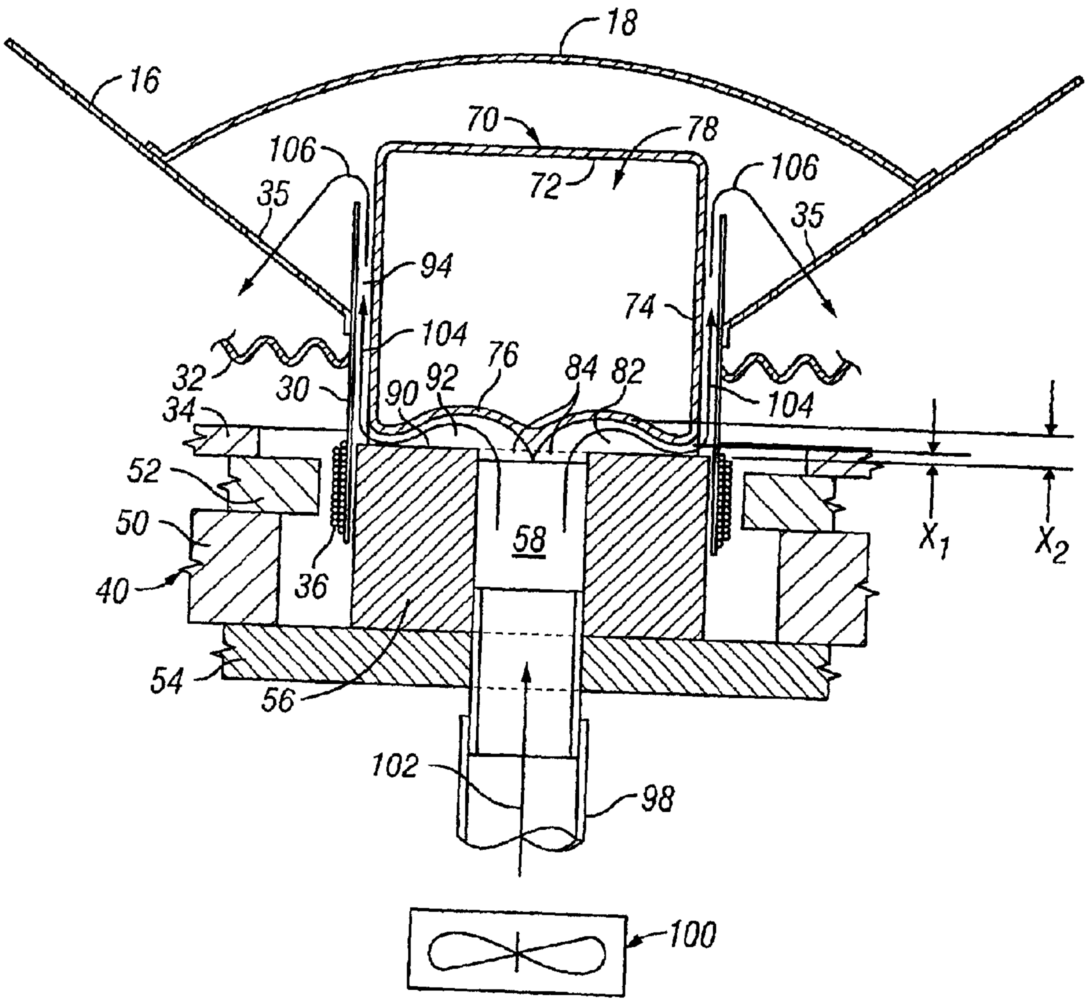
FIG. 2 is an enlarged sectional view of the voice coil and central portion of the magnet structure of the loudspeaker system shown in FIG. 1.

Referring now to the drawings, and to FIGS. 1 and 2 in particular, a loudspeaker system 10 with forced air circulation according to the present invention is illustrated. The loudspeaker system 10 comprises a loudspeaker diaphragm assembly 12 and a loudspeaker driver assembly 14 that operates the diaphragm assembly for producing acoustical output.

The diaphragm assembly 12 includes a cone 16 attached to a dome 18 through adhesive or the like to form a diaphragm 20. The diaphragm 20 has a flexible upper suspension 22 that is connected to an upper end 24 of a rigid frame 26. A lower end 28 of the cone 16 is connected to a former 30 which forms part of the driver assembly 14. The former 30 is in turn connected to the frame 26 through a flexible spider 32 that extends between the former 30 and a lower end 34 of the frame. With this arrangement, the diaphragm 20 is free to move in an axial direction but is restrained from movement in a radial direction with respect to the frame 26. Vent holes 35 are preferably formed in the cone 16 below the dome 18 for cooling the driver assembly 14, as will be described in greater detail below.

The driver assembly 14 includes a voice coil 36 mounted on the former 30 and a permanent magnet assembly 40 that cooperates with the voice coil 36 for driving the diaphragm 20.

The former 30 is generally tubular in shape and is preferably constructed of aluminum or other thermally conductive material. The voice coil 36 is typically constructed of aluminum or copper wire and is attached to the former 30 through a conventional adhesive, which may be of the thermally conductive type, so that heat generated in the voice coil 36 is conductively transferred to the former 30. The voice coil 36 is electrically connected to terminals 42 (only one shown) of the loudspeaker system 10 through wires 44 (only one shown).

The permanent magnet assembly 40 is generally annular in shape and is centrally located with respect to a central axis of the diaphragm assembly 12. The permanent magnet assembly 40 includes a permanent magnet 50 disposed between a top plate 52 and a bottom plate 54. The top plate 52 is rigidly connected to the frame 26. The top and bottom plates are constructed of a material capable of carrying magnetic flux, such as steel. A pole piece 56 of generally cylindrical shape is connected to the bottom plate 54 and extends generally toward the diaphragm 20. The pole piece 56 includes a pole vent 58 that is coincident with an opening 55 in the bottom plate 54. A space or gap 60 is formed between the pole piece 56 and the top plate 52, permanent magnet 50, and bottom plate 54. The voice coil 36 is positioned in the gap 60.

In operation, changing voltage is applied across the voice coil 36 through the terminals 42. The voice coil 36 in turn produces a magnetic field which interacts with the magnetic field produced by the permanent magnet assembly 40. The interaction of the magnetic fields causes the voice coil 36 to oscillate linearly in accordance with the applied changing voltage. Oscillation or the voice coil 36 in turn pumps the diaphragm 20 to generate sound.

A generally cup-shaped airflow director 70 is preferably positioned on the top of the pole piece 56. The airflow director 70 is preferably constructed of a relatively rigid material that exhibits stable material properties at the maximum operating temperature of the loudspeaker system 10, which is typically about 300° F. By way of example, the airflow director 70 can be constructed of a die-cast zinc material.

Figure 3:
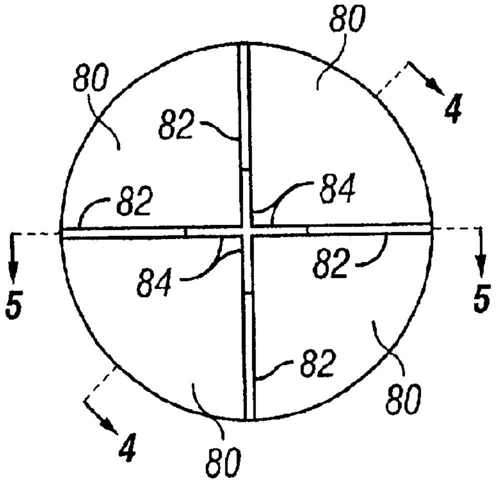
FIG. 3 is a bottom plan view of an airflow director that forms part of the loudspeaker system of FIG. 1.
Figure 4:
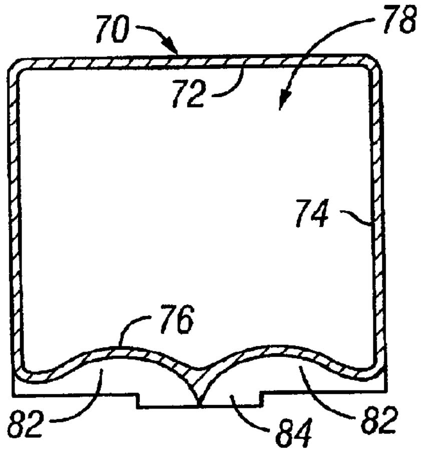
FIG. 4 is a sectional view of the airflow director taken along line 4—4 of FIG. 3.
Figure 5:
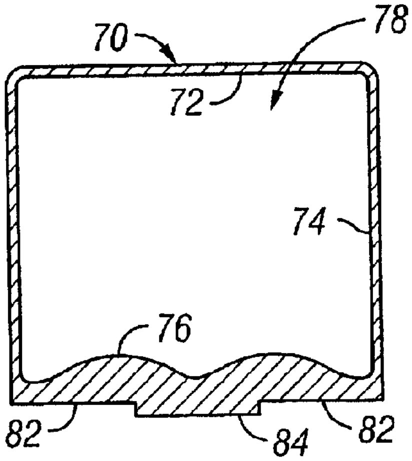
FIG. 5 is a sectional view of the airflow director taken along line 5—5 of FIG. 3.

With additional reference to FIGS. 3–5, the airflow director 70 preferably includes an upper wall 72, a bottom wall 76, and a continuous side wall 74 extending between the top and bottom walls to form a hollow interior 78. The bottom wall 76 is preferably concave and divided into sectors 80 with a support rib 82 extending between each sector. A raised rib portion 84 is preferably formed on an inner end of each rib 82. Preferably, the support ribs 82 and raised rib portions 84 intersect at the center of the airflow director 70. Each sector 80 is preferably concave in cross section as shown most clearly in FIG. 4.

The ribs 82 of the airflow director 70 are preferably bonded to an upper surface 90 (FIG. 2) of the pole piece 56 with a suitable high temperature adhesive. The raised rib portions 84 are preferably dimensioned so as to extend into and fit snugly with the pole vent 58. In this manner, the airflow director 70 can be quickly and easily aligned and installed on the pole piece 56 during assembly of the loudspeaker system 10. Although four ribs and four sectors are shown, it will be understood that more or less ribs and/or sectors can be provided.

The bottom wall 76, including the ribs 82, is preferably dimensioned and shaped to form a gap 92 between the upper surface 90 of the pole piece 56 and the bottom wall 76. Preferably, the sectors 80 of the bottom wall are concave so that an annular area of the gap 92 extending between the upper surface 90 of the pole piece 56 and the bottom wall 76 and transverse to the direction of air flow is substantially constant at generally any diameter of the gap. As shown in FIG. 2, the distance X1 between the pole piece 56 and the bottom wall 76 at an outer diameter of the gap 92 is generally less then the distance X2 between the pole piece and the bottom wall at a smaller diameter of the gap 92. The constant area is maintained at each annular area in the gap 92 due to the longer circumferential length associated with the distance X1 and the shorter circumferential length associated with the distance X2. Preferably, the annular cross sectional area of the gap 92 is approximately equal to a cross sectional area of the pole vein 58. The side wall 74 of the air flow director 70 is also preferably dimensioned and shaped to form a gap 94 between the former 30 and the side wall 74. Preferably, the cross sectional area of the gap 94 is also approximately equal to the cross sectional area of the pole vent 58. With this arrangement, air passing through the gaps 92, 94 and the pole vent 58 will be substantially unrestricted.

A tube or connector 98 is in fluid communication with the pole vent 58. The tube 98 is in turn connected to a blower 100, but may alternatively be connected to other sources of pressurized air.

In use, heat generated by the voice coil 36 is conducted along the former 30 adjacent the gap 94. Air under pressure from the blower 100 enters the pole vent 58, travels through the gaps 92 and 94, and exits the diaphragm assembly 12 through the vent holes 35, as shown by arrows 102, 104, and 106, respectively, to thereby remove heat from the former 30 via convective heat transfer. Thus, the voice coil 36 can be cooled during operation of the loudspeaker system 10 without forcing pressurized air through the relatively narrow gap 60 coincident with the voice coil 36. In this manner, the loudspeaker system 10 is capable of operation at higher temperatures and/or electrical power with less noise and distortion than the prior art.

Figure 6:
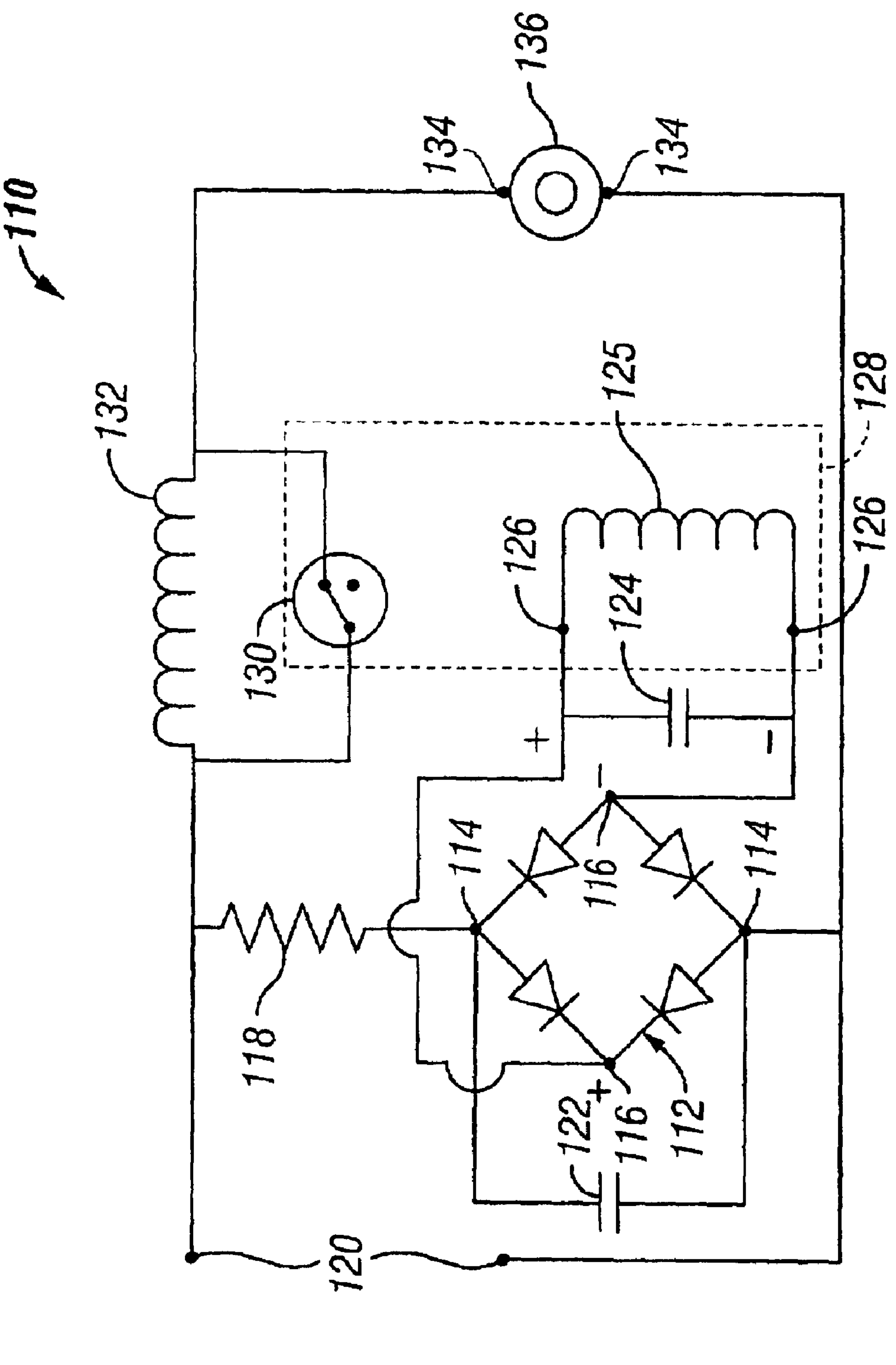
FIG. 6 is a schematic illustration of a blower control circuit in accordance with the present invention that forms part of the loudspeaker system of FIG. 1.

With reference now to FIG. 6, an exemplary blower control circuit 110 for dynamically controlling operation of the blower 100 is shown. The control circuit 110 includes full-wave bridge rectifier 112 with AC terminals 114 and DC terminals 116. A power resistor 118 is connected to one of the AC terminals 114, and the power resistor 118 and AC terminals 114 together are connected in parallel with input terminals 120. The input terminals 120 are in turn connected in parallel with the terminals 42 (FIG. 1) of the loudspeaker system 10 for connection with an audio signal source, such as an audio amplifier. A capacitor 122 is also connected in parallel with the AC terminals 114 of the full-wave bridge rectifier 112. The DC terminals 116 of the full-wave bridge rectifier 112 are connected in parallel with a capacitor 124 that is in turn connected in parallel with the coil terminals 126 of a coil 125 that forms part of a DC relay 128. A normally closed switch 130 that also forms part of the DC relay 128 is connected in parallel with a power limiting or reducing device 132, such as a high current inductor. The high current inductor 132 is connected in series between one of the two input terminals 120 and one terminal 134 of a blower motor 136 of the blower 100. The other terminal 134 of the blower motor 136 is connected to the other of the input terminals 120.

In operation, a voltage applied across the input terminals 120 of the blower control circuit 110 by an audio signal source, such as an audio power amplifier (not shown) or the like, also appears across the series circuit of the power resistor 118 and the AC terminals 114 of the full wave bridge rectifier 112 and the capacitor 122. This voltage causes a DC voltage to appear across the DC terminals 116, and consequently across the capacitor 124 and the coil terminals 126 of the DC relay 128. With the switch 130 of the DC relay in the closed position, the blower motor 136 is connected in parallel with the input terminals 120, and is thus directly driven by the audio power amplifier, so that any increase or decrease in voltage from the audio power amplifier results in a corresponding increase or decrease in speed of the blower motor 136, and thus an increase or decrease in the flow rate of air or other fluid exiting the blower 100. Without the control circuitry of the present invention, the blower motor could draw excessive current from the audio signal source as the voltage level increases, possibly exceeding the power capacity of the audio amplifier. Thus, in accordance with the present invention, when the voltage applied to the coil terminals 126 of the DC relay 128 reaches a predetermined level, the normally closed switch 130 of the DC relay 128 will open, thereby switching the high current inductor 132 in series with the blower motor 136. The presence of the high current inductor 132 in series with the blower motor 136 raises the impedance at the input terminals 120 of the blower control circuit 110, thus regulating or reducing the current drawn from the audio power amplifier and reducing the speed of the blower motor 136. However, the speed of the blower motor is still proportional to the audio signal, albeit at a lower range of speeds until the switch 130 closes.

It will be understood that other circuitry can be provided to regulate the speed of the blower motor 136, and thus the flow rate of air exiting the blower 100. By way of example, circuitry can be provided for maintaining the speed of the blower motor 136 to maintain the flow rate and/or increasing the speed of the blower motor 136 (and thus the flow rate) over a predetermined rise time and/or to a predetermined maximum value.

The specific operating characteristics of the motor control circuit 110 are dependent upon the particular values chosen for the electronic components. In particular, the resistance value of the power resistor 118 and the activation voltage of the DC relay 128 will determine the voltage level at which the switch 130 of the DC relay 128 will open and close. The inductance value of the high current inductor 132 will determine the magnitude of the impedance change, and consequently the magnitude of the reduction in current draw at the input terminals 120 and the magnitude of the reduction in speed of the blower motor 136. The capacitor 122 serves to reduce the amount of high frequency energy that is applied to the AC terminals 114 of the full-wave bridge rectifier 128. The capacitor 124, in conjunction with power resistor 118, sets the time constant of the blower control circuit 110.

In an exemplary blower control circuit 110 for a high powered loudspeaker 10, the power resistor 118 can be rated at five watts with a resistance of approximately 1300 ohms, the capacitor 122 can be a film capacitor with a capacitance of approximately two mfd, and the capacitor 124 can be an electrolytic capacitor with a 100 volt rating and a capacitance of approximately 220 mfd. The DC relay 128 can have a 24 volt coil, and the high current inductor 132 can have an inductance value of 16 mh and can be wound of No. 14 wire on an EI-112 laminated core that is approximately 1.25 inches thick. The blower motor 136 can be a 120 volt AC/DC type motor with a power capacity of 600 watts. A blower control circuit 110 with the component values thus described will switch from a higher to a lower speed when approximately 50 volts RMS of low frequency audio signal is applied to the input terminals 120. It will be understood that other values can be chosen to raise or lower the predetermined signal level for switching the blower from a higher to a lower speed.

Although the types of components and their exemplary values for the blower control circuit 110 have been described with particularity, it will be understood that the components can vary over a wide range of values. It will be further understood that the particular components and their relative arrangement in the blower control circuit can also vary. By way of example, the high current inductor 132 can be replaced with another power limiting component, such as a power resistor, although additional heat may be generated.

While the invention has been taught with specific reference to the above-described embodiments, those skilled in the art will recognize that changes can be made in form and detail without departing from the spirit and the scope of the invention. By way of example, although only a single blower is shown, it will be understood that a plurality of blowers can be provided for operation with the control circuitry. Thus, the described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

I claim:

1. A loudspeaker system comprising:

a diaphragm for producing sound;

a loudspeaker driver mechanism operable for moving the diaphragm in response to an applied electrical signal from an audio signal source, the loudspeaker driver mechanism comprising:

a generally tubular former connected to the diaphragm;

a voice coil connected to the former at a location spaced from the diaphragm, the former being constructed of a thermally conductive material for conducting heat away from the voice coil;

a permanent magnet having a central opening; and a pole piece having a pole vent opening that is coincident with the central opening, the voice coil being located in a space formed between the permanent magnet and the pole piece; and an airflow director positioned at least partially in the former, with a first gap being formed between the airflow director and the former, the first gap being in fluid communication with the pole vent opening;

wherein heat generated in the coil during operation of the loudspeaker is transferred to the former through conduction, and heat present in the former is transferred via convection to at least the first gap to thereby cool the loudspeaker system, the loudspeaker further comprising a blower positioned for directing air under pressure through the pole vent opening and the first gap wherein the blower comprises a blower motor, and the loudspeaker further comprising a control circuit electrically connected to the blower motor and adapted for connection to the audio signal source such that an increase in the applied electrical signal causes a corresponding increase in speed of the blower motor, wherein the control circuit comprises a power limiting device and a switching device connected in parallel with the power limiting device, the switching device being actuable from a normally closed state to an open state when the applied electrical signal is above a predetermined level to thereby regulate the speed of the blower motor.

2. A loudspeaker system according to claim 1, wherein the power limiting device comprises a high current inductor to thereby reduce the speed of the blower motor.

3. A loudspeaker system according to claim 2, wherein the switching device comprises a relay.

4. A loudspeaker system according to claim 1, wherein the control circuit further comprises a full-wave bridge rectifier with AC terminals adapted for connection to the audio signal source and DC terminals connected to the switching device.

5. A loudspeaker system according to claim 4, wherein the switching device comprises a DC relay.

6. A loudspeaker system according to claim 5, wherein the power limiting device comprises a high current inductor to thereby reduce the speed of the blower motor.

7. A loudspeaker system comprising:

a diaphragm for producing sound;

a loudspeaker driver mechanism operable for moving the diaphragm in response to an applied electrical signal from an audio signal source;

a blower positioned for directing air under pressure over the loudspeaker driver mechanism so that heat generated by the loudspeaker driver mechanism can be convectively removed; and a control circuit electrically connected to the blower and adapted for connection to the audio signal source such that an increase in the applied electrical signal causes a corresponding increase in speed of the blower, the control circuit comprising a power limiting device and a switching device connected in parallel with the power limiting device, the switching device being actuable from a normally closed state to an open state when the applied electrical signal is above a predetermined level to thereby regulate the speed of the blower.

8. A loudspeaker system according to claim 7, wherein the power limiting device comprises a high current inductor to thereby reduce the speed of the blower.

9. A loudspeaker system according to claim 8, wherein the switching device comprises a relay.

10. A loudspeaker system according to claim 7, wherein the control circuit further comprises a full-wave bridge rectifier with AC terminals adapted for connection to the audio signal source and DC terminals connected to the switching device.

11. A loudspeaker system according to claim 10, wherein the switching device comprises a DC relay.

12. A loudspeaker system according to claim 11, wherein the power limiting device comprises a high current inductor to thereby reduce the speed of the blower.

* * * * *